(12) United States Patent
Matsumoto et al.

(10) Patent No.: US 6,489,906 B2
(45) Date of Patent: Dec. 3, 2002

(54) ΔΣ TYPE A/D CONVERTER

(75) Inventors: Masahiro Matsumoto, Hitachi (JP); Fumio Murabayashi, Urizuna-machi (JP); Tatsumi Yamauchi, Hitachioota (JP); Keiji Hanzawa, Mito (JP)

(73) Assignees: Hitachi, Ltd., Tokyo (JP); Hitachi Car Engineering Co., Ltd., Hitachinaka (JP)

( * ) Notice: Subject to any disclaimer, the term of this patent is extended or adjusted under 35 U.S.C. 154(b) by 0 days.

(21) Appl. No.: 09/785,552

(22) Filed: Feb. 20, 2001

(65) Prior Publication Data

US 2001/0030621 A1 Oct. 18, 2001

(30) Foreign Application Priority Data

Feb. 23, 2000 (JP) ......................................... 2000-052189

(51) Int. Cl.[7] ............................................... H03M 3/00
(52) U.S. Cl. ........................ 341/143; 341/144; 341/155
(58) Field of Search ................................ 341/143, 144, 341/145, 155, 156, 110, 118, 114, 120, 126

(56) References Cited

U.S. PATENT DOCUMENTS

| 5,101,205 | A | * | 3/1992 | Yasuda ........................ 341/155 |
| 5,150,324 | A | * | 9/1992 | Takasuka et al. ........... 364/807 |
| 5,311,181 | A | * | 5/1994 | Ferguson, Jr. et al. ...... 341/143 |
| 5,621,408 | A | * | 4/1997 | Cake et al. .................. 341/143 |
| 6,275,177 | B1 | * | 8/2001 | Ho et al. ..................... 341/143 |
| 6,292,121 | B1 | * | 9/2001 | Cake et al. .................. 341/143 |

FOREIGN PATENT DOCUMENTS

| JP | 11-150784 | 2/1999 |
| JP | 11-145829 | 5/1999 |

* cited by examiner

Primary Examiner—Brian Young
Assistant Examiner—John Nguyen
(74) Attorney, Agent, or Firm—Crowell & Moring LLP

(57) ABSTRACT

A ΔΣ type AD converter includes a local D/A converter having a SC integrator which is constructed by an analog switch operated at the first and second timings of an input 1, an analog switch operated at the first and second timings of an input 2, an analog switch operated at the first and second timings without selection of the input, a capacitor charged and discharged by these analog switches and an operational amplifier (21), a comparator (22), a D-type flip-flop (28), a switch (29) and reference voltage sources (30, 31).

4 Claims, 5 Drawing Sheets

ΔΣ TYPE A/D CONVERTER

BACKGROUND OF THE INVENTION

The present invention relates generally to a ΔΣ type A/D converter. More particularly, the invention relates to a ΔΣ type A/D converter which can switch a measurement range and an input signal.

A ΔΣ type AD converter permitting switching of a measurement range has been disclosed in Japanese Patent Application Laid-Open No. Heisei 11 (1999)-145829 which discloses an A/D converter performing gain adjustment by varying performance of D/A converting means. Namely, a performance variable D/A converter is provided, in which the performance of the D/A converter is controlled without providing gain variable device on an input side by supplying a control signal to a control terminal of the D/A converter for achieving gain control. On the other hand, the ΔΣ type AD converter handling a plurality of inputs has been disclosed in Japanese Patent Application Laid-Open No. Heisei 11(1999)-150784, which includes a plurality of microphones converting input acoustic energy into electrical signal in predetermined partial band, a plurality of A/D converting elements converting into digital codes and means for synthesizing outputs of the A/D converting elements.

In the prior art set forth above, no consideration has been made for switching of a measurement range or switching of the input signal. At first, the A/D converter having a gain control function as disclosed in Japanese Patent Application Laid-Open No. Heisei 11-145829 does consider a gain but does not consider an offset. On the other hand, the microphone device consisted of a plurality of partial band microphones as disclosed in Japanese Patent Application Laid-Open No. Heisei 11-150784, it has been required to arrange A/D converters of number corresponding to number of inputs so as to handle a plurality of inputs.

When an input for the ΔΣ type AD converter is unspecified, it is not possible to see amplitude and offset of the input signal in advance. On the other hand, when a plurality of inputs are used with switching therebetween, amplitudes and offsets of respective inputs may be different. For adapting to this, it can be considered to arrange variable gain amplifier for each input signal at preceding stage of the ΔΣ type AD converter. However, in this case, scale of the circuit becomes quire large. On the other hand, when A/D conversion is to be performed for a plurality of inputs, if A/D converters in number corresponding to number of inputs are arranged, scale of the circuit becomes unacceptably large. To this fact, the foregoing prior art have given no consideration.

SUMMARY OF THE INVENTION

The present invention has been worked out for solving the problems set forth above. It is therefore an object of the present invention to provide a ΔΣ type AD converter which can arbitrarily set conversion range to permit setting of an optimal conversion range depending upon the input signal.

In order to accomplish the object set forth above, according to the present invention, a ΔΣ type AD converter comprising:

a local D/A converter having at least a first output voltage level and a second output voltage level;

an integrator integrating a difference of an input signal and an output of the local D/A converter;

a comparator comparing the outputs of the integrator;

means for varying the output of the local D/A converter depending upon an output of the comparator; and switching means for switching the first output voltage level and the second output voltage level of the local D/A converter.

On the other hand, it may have polarity inverting means for inverting polarity of the output signal of the local D/A converter. Furthermore, according to the present invention, a ΔΣ type AD converter comprises:

switching means for switching a plurality of input signals an integrator integrating a difference of an output signal of the switching means and an output of the local D/A converter;

a plurality of capacitors holding an integrated value of the integrator; and means for switching said capacitors depending upon switching of said switching circuit.

DETAILED DESCRIPTION OF THE PREFERRED EMBODIMENTS

The present invention will be discussed hereinafter in terms of the mode for implementing the present invention with reference to the accompanying drawings.

Figure 1:
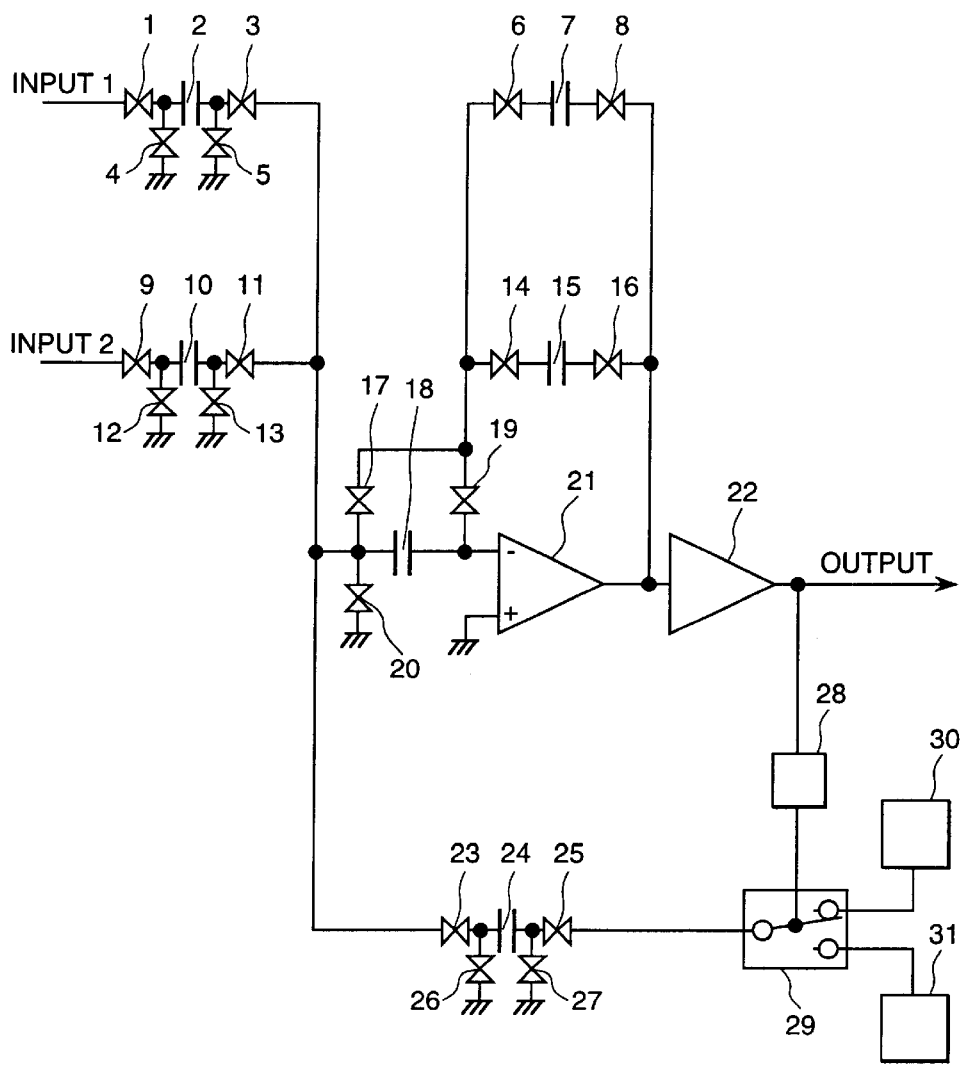
FIG. 1 is a circuit diagram showing a construction of the first embodiment of the ΔΣ type AD converter according to the present invention.

At first, the first embodiment of a ΔΣ type AD converter according to the present invention will be discussed with reference to FIG. 1. FIG. 1 shows a construction of the A/D converter.

The shown embodiment of the ΔΣ type AD converter has analog switches 1, 3, 6 and 8 operated at a first timing and analog switches 4 and 5 operated at a second timing when an input 1 is to be A/D converted. Also, the ΔΣ type AD converter has analog switches 9, 11, 14 and 16 operated at a first timing and analog switches 12 and 13 operated at a second timing when an input 2 is A/D converted. The ΔΣ type AD converter further includes analog switches 17, 23 and 25 operated at a first timing and analog switches 19, 20, 26 and 27 operated at a second timing irrespective of selection of the input. The ΔΣ type AD converter further includes an SC integrator consisted of capacitors 2, 7, 10, 15, 18 and 24 charged and discharged by ON/OFF operations of the analog switches and an operational amplifier 21, a comparator 22, D-type flip-flop 28, and a local D/A converter consisted with a switch 29 and reference voltage sources 30 and 31.

When the input 1 is selected, the SC integrator charges and discharges a charge proportional to the input 1 to the capacitor 2 and the charge-and-discharged charge is then transferred to the capacitor 7.

On the other hand, when the input 2 is selected, the SC integrator charges and discharges a charge proportional to the input 2 to the capacitor 10 and the charge-and-discharged charge is then transferred to the capacitor 15. As set forth above, by switching the capacitors 7 and 15 for integration depending upon switching of the input signal, a delay of the ΔΣ type AD converter to be caused upon switching the input can be shortened. Namely, it becomes possible to perform switching of the input signals at high speed. In the shown method, in comparison with the method, in which the A/D converters in number corresponding to number of the input signals, scale of the circuit can be made much smaller.

On the other hand, in the SC integrator, an offset voltage of the operational amplifier 21 is charged to the capacitor 18 by turning ON the analog switches 19 and 20 at the second timing for eliminating influence of an offset voltage of the operational amplifier 21 for the charge charge-and-discharging the capacitors 2 and 10 by turning ON the analog switch 17 at the first timing. By compensating the offset voltage of the operational amplifier 21 in real time by means of this offset voltage compensating means, an offset of the SC integrator per se can be eliminated. On the other hand, by suppressing fluctuation of voltage (voltage proportional to the output voltage) between a positive phase input terminal and an inverted input terminal due to lack of gain of the operational amplifier 21, degradation of S/N ratio to be caused by fluctuation of the voltage between the positive phase input terminal and the inverted input terminal can be reduced. In addition, 1/f noise generated in the operational amplifier 21 can also be reduced.

Next, discussion will be given for local D/A converter. The local D/A converter is a circuit for switching the output of the switch 29 between the reference voltage source 30 and the reference voltage source 31 depending upon the output of the D-type flip-flop. Here, the voltage of the reference voltage source 30 is a voltage corresponding to an upper conversion range of the a ΔΣ type AD converter, and the voltage of the reference voltage source 31 is a voltage corresponding to a lower conversion range of the ΔΣ type AD converter. Accordingly, by permitting arbitrarily setting of the voltage of the reference voltage sources 30 and 31, the input range of the ΔΣ type AD converter can be set arbitrarily.

On the other hand, since resolution of the ΔΣ type AD converter is not related to conversion range, if the ΔΣ type AD converter is designed to have 10 bits of resolution, 10 bits of resolution can be obtained irrespective whether the conversion range is large or small. The reason is that since the conversion range and quantization noise to be generated by the comparator is proportional to the amplitude of the local D/A converter, a ratio of the conversion range and the quantization noise which determines the resolution becomes constant. Namely, the conversion range can be made larger and smaller with maintaining the resolution. Accordingly, by arbitrarily setting the voltages of the reference voltage sources 30 and 31 as in the construction of the shown embodiment, the conversion range can be set arbitrarily, and even in the small conversion range, resolution can be maintained.

On the other hand, by permitting to arbitrarily set the value of the reference voltage sources 30 and 31, the optimal conversion range can be set for the signal source connected to the ΔΣ type AD converter.

On the other hand, by switching the outputs of the reference voltage sources 30 and 31 depending upon switching of the input, the optimal conversion range can be set per the input signal.

Figure 2:
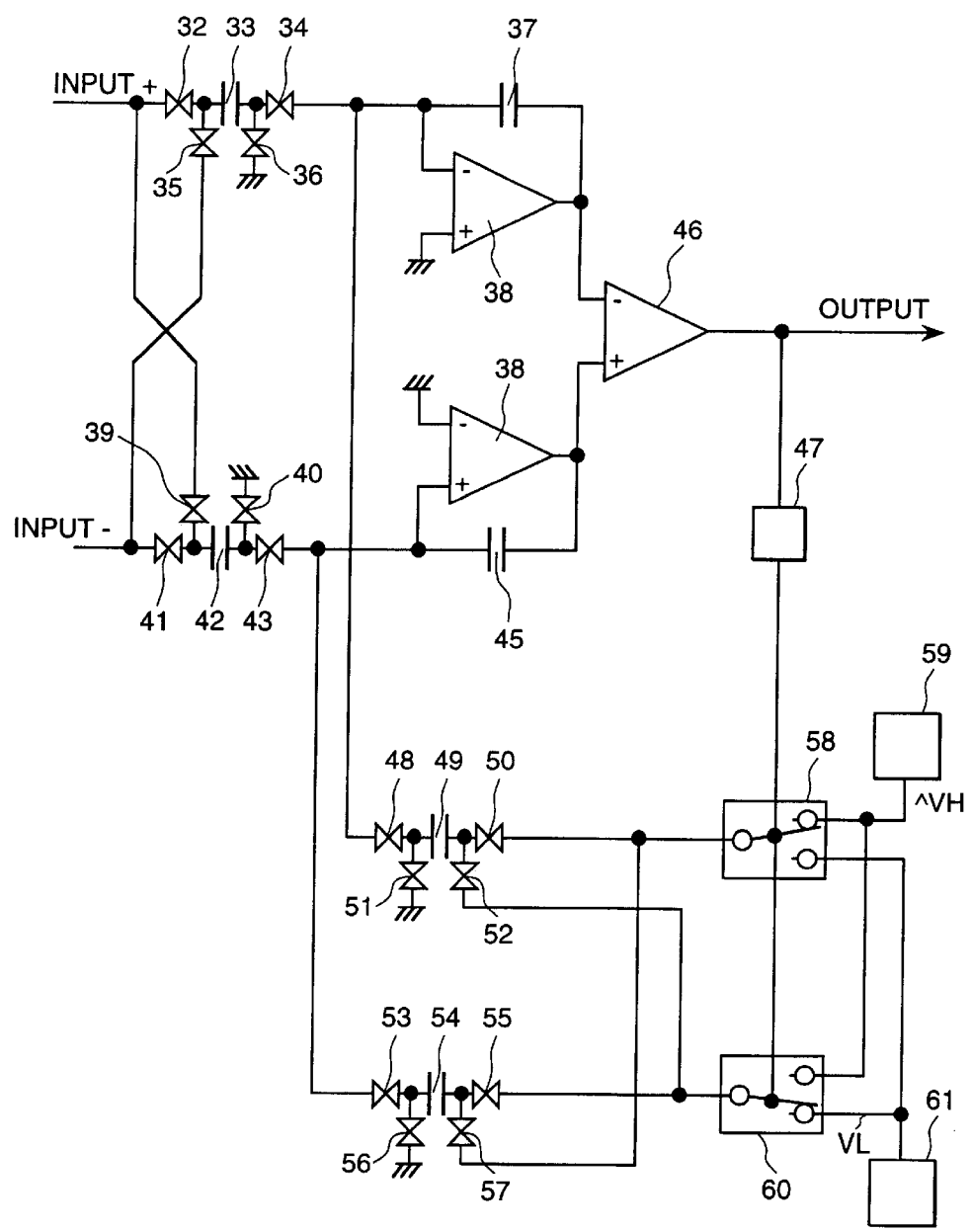
FIG. 2 is a circuit diagram showing a construction of the second embodiment of the ΔΣ type AD converter according to the present invention.
Figure 3:
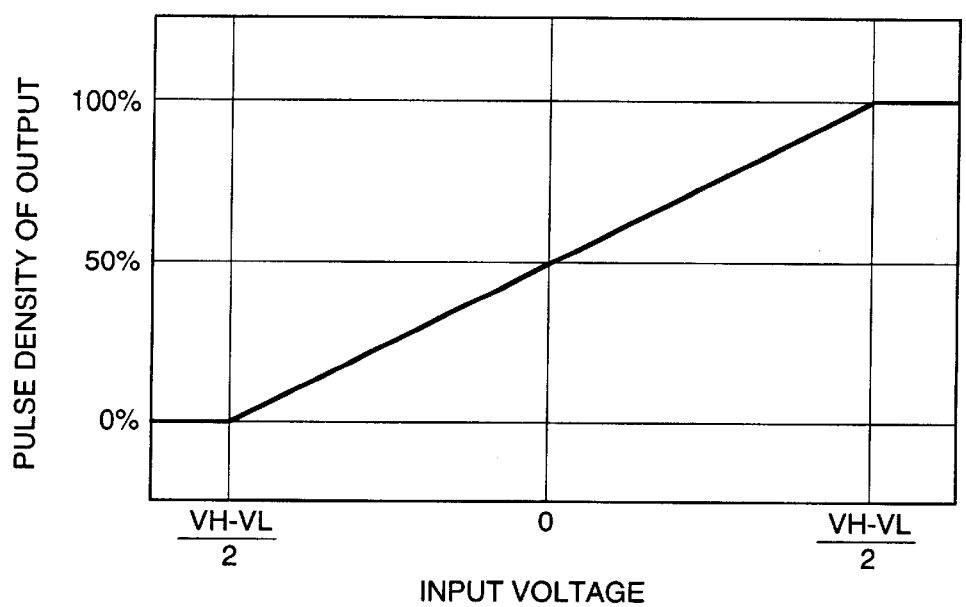
FIG. 3 is a chart showing input/output characteristics of the second embodiment of the ΔΣ type AD converter according to the invention.

Next, the second embodiment of the ΔΣ type AD converter according to the present invention will be discussed with reference to FIGS. 2 and 3. It should be noted that FIG. 2 shows a construction of the second embodiment of the ΔΣ type AD converter and FIG. 3 shows an input/output characteristics of the second embodiment of the ΔΣ type AD converter.

The shown embodiment of the ΔΣ type AD converter has analog switches 32, 34, 41, 43, 48, 50, 53 and 55 operated at the first timing and analog switches 35, 36, 39, 40, 51, 52, 56 and 57 operated at the second timing, a SC integrator consisted of capacitors 33, 37, 42, 45, 49 and 54 charged and discharged by the analog switches and an operational amplifiers 38 and 44, a comparator 46, a D-type flip-flop 47, and a local D/A converter consisted of switches 58 and 60 and reference voltage sources 59 and 61.

The shown embodiment of the ΔΣ type AD converter is constructed by providing two SC integrators to operate each SC integrator in differential manner to reduce influence of power source noise. In the shown embodiment of the ΔΣ type AD converter, for adapting top differential operation of the SC integrator, the local D/A converter has two switches 58 and 60 for switching the voltage of respective reference voltage sources 59 and 61 in reverse phase. By operating the local D/A converter in this manner, the conversion range of the shown embodiment of the ΔΣ type AD converter can be varied as illustrated in FIG. 3 depending upon the voltages of the reference voltage sources 59 and 61. Namely, in the shown embodiment of the ΔΣ type AD converter, span of the conversion range can be arbitrarily set depending upon an output voltage VH of the reference voltage source 59 and the output voltage VL of the reference voltage source 61. It should be noted that since offset is not influenced by the output voltage VH of the reference voltage source 59 and the output voltage VL of the reference voltage source 61, stable offset characteristics can be obtained.

Figure 4:
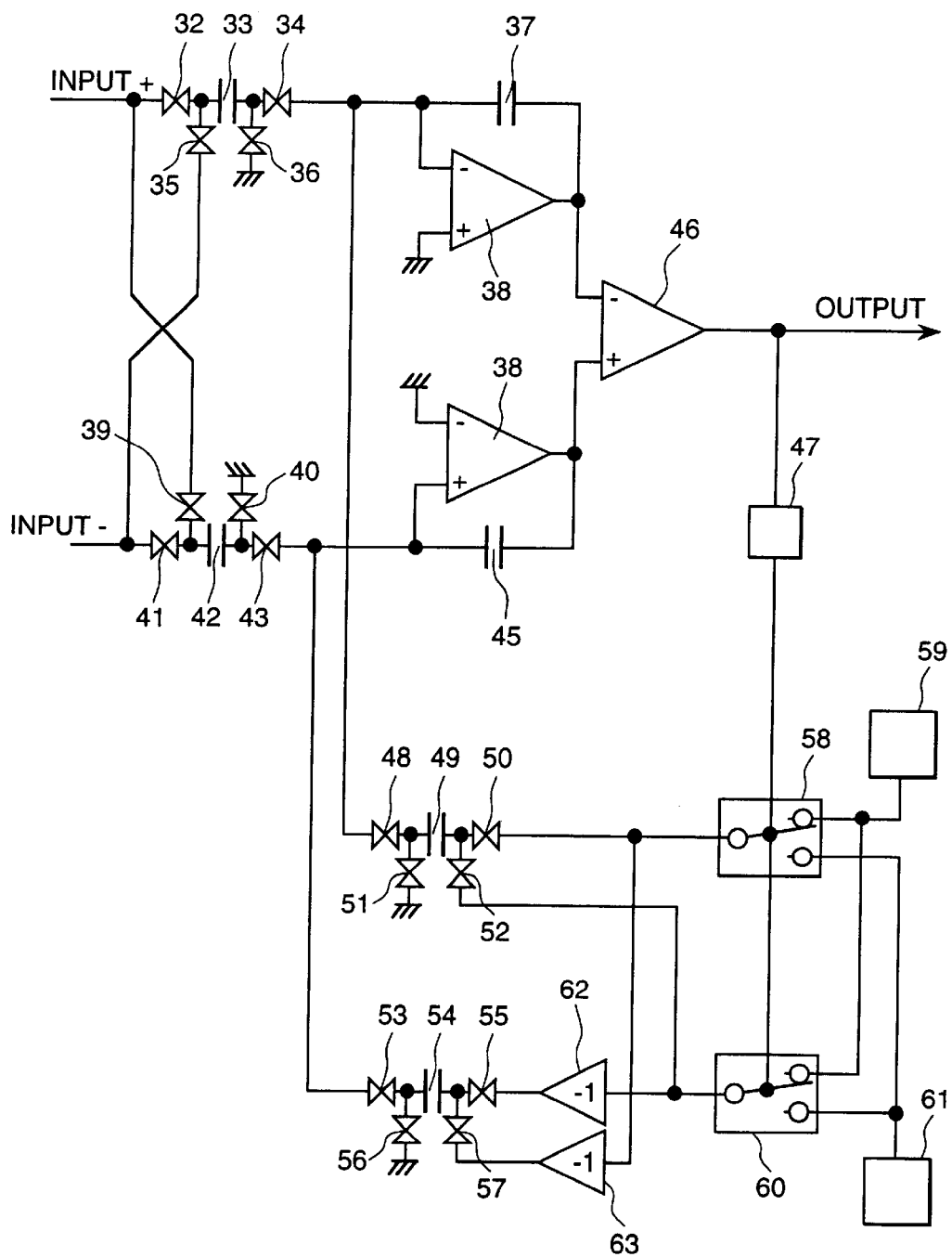
FIG. 4 is a circuit diagram showing a construction of the third embodiment of the ΔΣ type AD converter according to the present invention.
Figure 5:
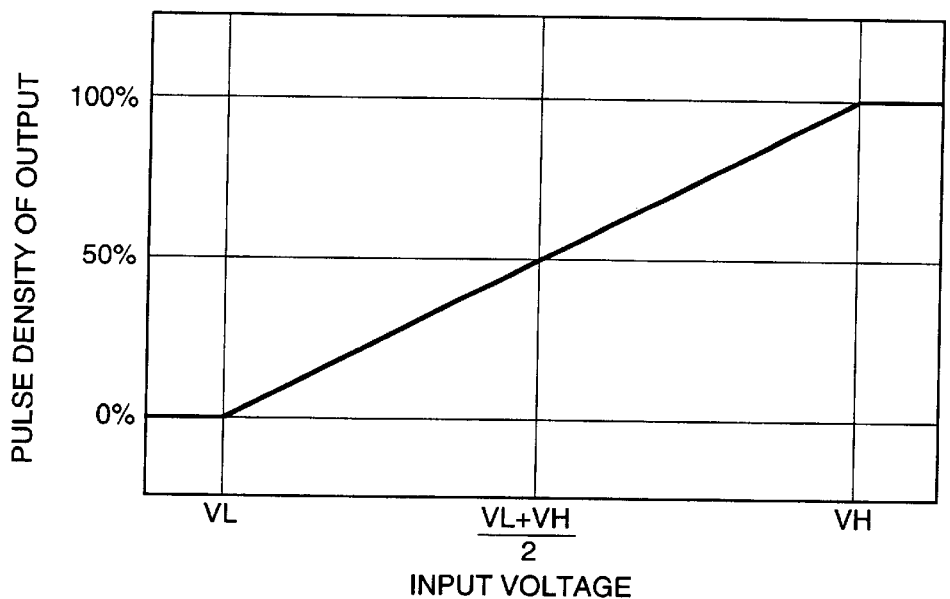
FIG. 5 is a chart showing an input/output characteristics of the third embodiment of the ΔΣ type AD converter according to the invention.

Next, the third embodiment of the ΔΣ type AD converter according to the present invention will be discussed with reference to FIGS. 4 and 5. FIG. 4 shows a construction of the third embodiment of the ΔΣ type AD converter, and FIG. 5 shows an input/output characteristics of the third embodiment of the ΔΣ type AD converter.

The shown embodiment of the ΔΣ type AD converter is constructed by adding inverter circuits 62 and 63 to the second embodiment of the ΔΣ type AD converter set forth above. By adding the inverter circuits 62 and 63, it becomes possible to determine an upper conversion range of the ΔΣ type AD converter by the output voltage VH of the reference voltage source 59 and to determine a lower conversion range of the ΔΣ type AD converter by the output voltage VL of the reference voltage source 61. With such construction, the input range of the ΔΣ type AD converter can be adjusted arbitrarily. It should be noted that while the shown embodiment is provided the inverter circuits 62 and 63, similar effect may be attained by operating the analog switch 55 at the second timing and operating the analog switch 57 at the first timing.

Figure 6:
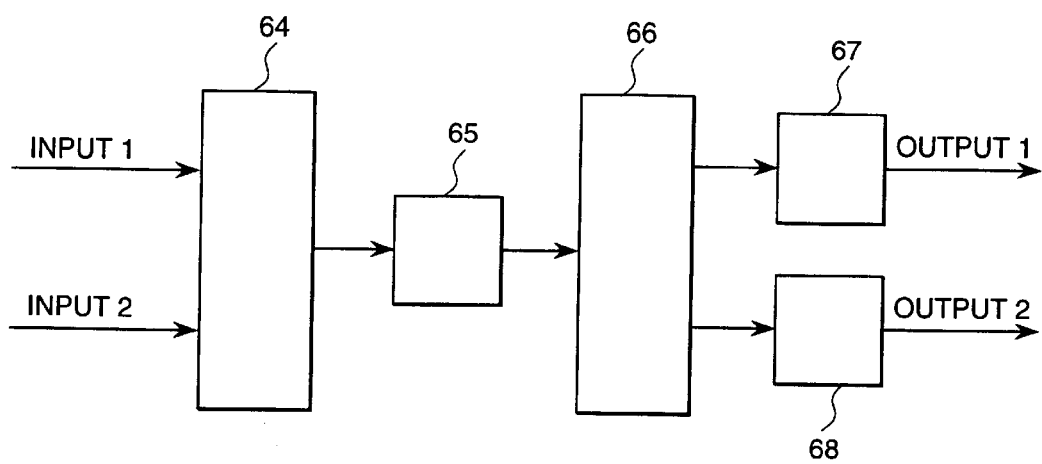
FIG. 6 is a circuit diagram showing a construction of the fourth embodiment of the ΔΣ type AD converter according to the present invention.

Next, the fourth embodiment of the ΔΣ type AD converter according to the present invention will be discussed with reference to FIG. 6. FIG. 6 shows the construction of the fourth embodiment of the ΔΣ type AD converter.

The shown embodiment of the ΔΣ type AD converter is constructed with a switch circuit 64 for switching input 1 and input 2, a ΔΣ modulator 65, a switch circuit 66 operated in synchronism with the switch circuit 64 and decimeter filters 67 and 68.

The shown embodiment of the ΔΣ type AD converter switches the decimeter filters 67 and 68 depending upon switching of the input to permit high speed switching of the decimeter filters 67 and 68 which have the lowest operation speeds.

With the present invention, since the conversion range of the ΔΣ type AD converter can be set arbitrarily, the optimal conversion range can be set depending upon the input signal. Also, since the input signal can be set at high speed, it becomes unnecessary to arrange the ΔΣ type AD converters in number corresponding to number of the inputs. Thus, down-sizing of the circuit scale can be achieved.

What is claimed is:

1. A ΔΣ type AD converter comprising:

a local D/A converter having at least a first output voltage level and a second output voltage level;

an integrator integrating a difference of an input signal and an output of said local D/A converter;

a comparator comparing the outputs of said integrator;

means for varying the output of said local D/A converter between said first output voltage level and said second output voltage level depending upon an out put of said comparator;

first switching means for switching a voltage value of said first output voltage level; and second switching means for switching a voltage value of said second output voltage level.

2. A ΔΣ type AD converter comprising:

a local D/A converter having at least a first output voltage level and a second output voltage level;

an integrator integrating a difference of an input signal and an output of said local D/A converter;

a comparator comparing the outputs of said integrator;

means for varying the output of said local D/A converter depending upon an output of said comparator; and polarity inverting means for inverting polarity of the output signal of said local D/A converter.

3. A ΔΣ type AD converter comprising:

a local D/A converter having at least a first output voltage level and a second output voltage level;

selecting means for selecting a plurality of input signals;

an integrator integrating a difference of an output signal of said switching means and an output of said local D/A converter;

a comparator comparing the outputs of said integrator;

means for varying the output of said local D/A converter depending upon an output of said comparator;

a plurality of capacitors holding an integrated value of said integrator; and means for selecting said capacitors depending upon results of said selecting means.

4. A ΔΣ type AD converter comprising:

a local D/A converter having at least a first output voltage level and a second output voltage level;

selecting means for selecting a plurality of input signals;

an integrator integrating a difference of an output signal of said selecting means and an output of said local D/A converter;

a comparator comparing the outputs of said integrator;

means for varying the output of said local D/A converter depending upon an output of said comparator;

a plurality of arithmetic means; and selecting means for selecting said plurality of arithmetic means depending upon switching of said plurality of input signals.

* * * * *